(12) United States Patent
Park et al.

(10) Patent No.: US 11,968,783 B2
(45) Date of Patent: Apr. 23, 2024

(54) WIRELESS COMMUNICATION BOARD AND ELECTRONIC DEVICE HAVING SAME

(71) Applicant: Samsung Electronics Co., Ltd., Suwon-si (KR)

(72) Inventors: Jongwon Park, Suwon-si (KR); Jaegeun Son, Suwon-si (KR); Jaechan Lee, Suwon-si (KR); Sunil Jin, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 220 days.

(21) Appl. No.: 17/653,601

(22) Filed: Mar. 4, 2022

(65) Prior Publication Data

US 2022/0192023 A1 Jun. 16, 2022

Related U.S. Application Data

(63) Continuation of application No. PCT/KR2020/011789, filed on Sep. 2, 2020.

(30) Foreign Application Priority Data

Sep. 6, 2019 (KR) .................. 10-2019-0110905

(51) Int. Cl.
*H05K 1/14* (2006.01)
*H01R 12/52* (2011.01)
(Continued)

(52) U.S. Cl.
CPC ............. *H05K 1/144* (2013.01); *H01R 12/52* (2013.01); *H01R 12/57* (2013.01);
(Continued)

(58) Field of Classification Search
CPC ........ H05K 1/144; H05K 1/111; H01R 12/52; H01R 12/57; H01R 12/7082; H01R 31/06; H01R 12/721
(Continued)

(56) References Cited

U.S. PATENT DOCUMENTS 7,119,749 B2 10/2006 Miyata et al.
8,018,922 B2 9/2011 Oak
(Continued)

FOREIGN PATENT DOCUMENTS

EP 3113295 B1 4/2021
JP 4003077 B2 11/2007
(Continued)

OTHER PUBLICATIONS

International Search Report and Written Opinion of the International Searching Authority in connection with International Application No. PCT/KR2020/011789 dated Dec. 11, 2020, 9 pages.
(Continued)

*Primary Examiner* — Andargie M Aychillhum

(57) ABSTRACT

A wireless communication board comprises: a communication board; a wireless communication part disposed on the communication board; a power supply provided on the communication board and configured to supply a power source to the wireless communication part; a surface mounting pad that is connected to the wireless communication part and power supply and disposed on a main board by means of the surface mounting technology; and a wire connection connected to the wireless communication part and power supply and connected to the main board by means of a wire, wherein the main board comprises a main processor for controlling the operation of an electronic device.

20 Claims, 19 Drawing Sheets

(51) Int. Cl.
  *H01R 12/57* (2011.01)
  *H01R 12/70* (2011.01)
  *H01R 31/06* (2006.01)
  *H05K 1/11* (2006.01)
  *H01R 12/72* (2011.01)
  *H01R 12/75* (2011.01)

(52) U.S. Cl.
  CPC ......... *H01R 12/7082* (2013.01); *H01R 31/06* (2013.01); *H05K 1/111* (2013.01); *H01R 12/721* (2013.01); *H01R 12/75* (2013.01); *H05K 2201/041* (2013.01); *H05K 2201/10098* (2013.01); *H05K 2201/10189* (2013.01)

(58) Field of Classification Search
  USPC .......................................................... 361/784
  See application file for complete search history.

(56) References Cited

U.S. PATENT DOCUMENTS

| | | |
|---|---|---|
| 9,907,187 B1 | 2/2018 | Tseng |
| 10,098,179 B2 | 10/2018 | Yamamichi et al. |
| 10,727,568 B2 | 7/2020 | Cho et al. |
| 2005/0243001 A1 | 11/2005 | Miyata et al. |
| 2006/0276157 A1 | 12/2006 | Chen et al. |
| 2009/0040117 A1 | 2/2009 | Miyaura et al. |
| 2011/0264271 A1 | 10/2011 | Valentini |
| 2012/0271482 A1* | 10/2012 | Tsukazawa ............. G06F 1/203 700/300 |
| 2016/0302304 A1 | 10/2016 | Ikuta |
| 2018/0261900 A1* | 9/2018 | Kim .................... H01M 10/425 |
| 2019/0028137 A1 | 1/2019 | O'Neill |
| 2019/0150381 A1 | 5/2019 | Tennyson et al. |
| 2019/0191546 A1 | 6/2019 | Fujii |
| 2019/0304513 A1 | 10/2019 | Chang et al. |

FOREIGN PATENT DOCUMENTS

| | | |
|---|---|---|
| JP | 2012256326 A | 12/2012 |
| JP | 6045436 B2 | 12/2016 |
| JP | 2017-021961 A | 1/2017 |
| KR | 100538903 B1 | 12/2005 |
| KR | 20150082861 A | 7/2015 |
| KR | 20170003426 A | 1/2017 |
| KR | 20170140691 A | 12/2017 |
| KR | 20180121315 A | 11/2018 |

OTHER PUBLICATIONS

Office Action issued Feb. 23, 2024, in connection with Korean Patent Application No. 10-2019-0110905, 22 pages.

* cited by examiner

WIRELESS COMMUNICATION BOARD AND ELECTRONIC DEVICE HAVING SAME

CROSS-REFERENCE TO RELATED APPLICATIONS

This application is a bypass continuation of International Application No. PCT/KR2020/011789, filed Sep. 2, 2020, which claims priority to Korean Patent Application No. 10-2019-0110905, filed Sep. 6, 2019, the disclosures of which are herein incorporated by reference in their entirety.

BACKGROUND

1. Field

The disclosure relates to a wireless communication board that can be used by being connected to a main board of an electronic device, and an electronic device having the same.

2. Description of Related Art

With the development of electronic technology, electronic devices that can be controlled wirelessly from the outside have been developed and used.

For example, in order to implement home automation in home, electronic devices such as refrigerators, washing machines, air conditioners, ovens, and the like may be configured to be controlled by a mobile device such as a smartphone.

To this end, an electronic device includes a wireless communication board capable of performing wireless communication with a mobile device.

In general, the wireless communication board is formed separately from the main board that controls the operation of the electronic device, and is connected to the main board through an interface.

The wireless communication board according to the prior art may be classified into two types according to the structure of the interface.

One of them is applied to an electronic device in which a wireless communication board and a main board are disposed to be spaced apart by a predetermined distance, and the wireless communication board is configured to be connected to the main board through a wire.

The other of them is applied to an electronic device in which the wireless communication board is disposed on the main board, and the wireless communication board is connected to the main board by soldering.

However, manufacturing two types of wireless communication boards having the same function according to the type of the interface, that is, the connection structure increases the number of parts that a factory manufacturing various electronic devices needs to manage. Accordingly, there is a problem in that the management cost of the parts increases.

Accordingly, it is required to develop a wireless communication board that can be used regardless of a connection structure.

SUMMARY

The disclosure is made in view of the above problems, and relates to a wireless communication board that can be used regardless of a connection structure, including both a surface mounting pad and a wire connection, and an electronic device having the same.

According to an aspect of the disclosure, a wireless communication board may include a communication board; a wireless communication part disposed on the communication board; a power supply disposed on the communication board and configured to supply power to the wireless communication part; a surface mounting pad connected to the wireless communication part and the power supply, the surface mounting pad disposed on the main board by surface mounting technology; and a wire connection connected to the wireless communication part and the power supply, the wire connection configured to be connected to the main board by a wire, wherein the main board may include a main processor configured to control operation of the electronic device.

The surface mounting pad may include a plurality of pads provided on a surface of the communication board. The plurality of pads may include signal transmission pads and power supply pads.

The wire connection may include a connector disposed on the communication board. The connector may include signal transmission terminals and power supply terminals.

The wire connection may include a plurality of contacts and connector couplings provided on an edge of the communication board.

The wireless communication board may include a board insertion connector including a plurality of corresponding contacts that are in contact with the plurality of contacts of the wire connection and corresponding coupling parts coupled to the connector couplings, wherein the edge of the communication board is inserted into the board insertion connector so that the board insertion connector is connected to the wire connection.

The wireless communication part may include Wi-Fi, Zig bee, Z-wave, and Bluetooth.

According to another aspect of the disclosure, a wireless communication board that is connected to a main board of an electronic device, the wireless communication board may include a communication board; a wireless communication part disposed on the communication board; a power supply disposed on the communication board and configured to supply power to the wireless communication part; a short-range communication part connected to the wireless communication part and configured to wirelessly transmit and receive a signal to and from a main short-range communication part provided on the main board; a surface mounting pad connected to the power supply, the surface mounting pad disposed on the main board by surface mounting technology; and a wire connection connected to the power supply, the wire connection configured to be connected to the main board by a wire.

The surface mounting pad may include a power pad and a ground pad formed on a surface of the communication board.

The wire connection may include a connector that is disposed on the communication board and includes a power terminal and a ground terminal.

The wire connection may include a power contact, a ground contact, and connector couplings provided on an edge of the communication board.

The short-range communication part may include a radio frequency identification RFID, near field communication NFC, and infrared ray communication.

According to another aspect of the disclosure, an electronic device may include a main board; and a wireless communication board connected to the main board. The main board may include: a main circuit board; a main processor disposed on the main circuit board and configured to control the electronic device; a communication connection provided on the main circuit board and configured to be connected to the wireless communication board; and a main power supply disposed on the main circuit board and configured to supply power to the main processor and the wireless communication board. The wireless communication board may include a communication board; a wireless communication part disposed on the communication board; a power supply disposed on the communication board and configured to supply power to the wireless communication part; a surface mounting pad formed on the communication board to be disposed on the main board by surface mounting technology; and a wire connection provided on the communication board to be connected to the main board with a wire. The communication connection of the main board may be formed to correspond to one of the surface mounting pad and the wire connection of the wireless communication board.

The communication connection of the main board may be formed as a plurality of pads corresponding to a plurality of pads of the surface mounting pad of the wireless communication board, and the wireless communication board may be disposed on the communication connection of the main board by surface mounting technology.

The communication connection of the main board may include a connector corresponding to a connector forming the wire connection of the wireless communication board. The wireless communication board may include a connection wire provided with connectors corresponding to the connector of the main board and the connector of the wireless communication board at both ends thereof and connecting the connector of the main board and the connector of the wireless communication board.

The surface mounting pad of the wireless communication board may include a plurality of signal transmission pads connected to the wireless communication part and a power pad and a ground pad connected to the power supply. The connector forming the wire connection of the wireless communication board may include a plurality of signal transmission terminals connected to the wireless communication part, and a power terminal and a ground terminal connected to the power supply.

The main board may include a main short-range communication part connected to the main processor. The communication connection of the main board may be connected to the main power supply. The wireless communication board may include a short-range communication part that is connected to the wireless communication part and is configured to wirelessly communicate with the main short-range communication part. The surface mounting pad of the wireless communication board may include a power pad and a ground pad connected to the power supply. The wire connection of the wireless communication board may include a connector connected to the power supply.

Advantageous Effects

The wireless communication board according to certain embodiments having the structure as described above includes both connection structures, that is, a surface mounting pad and a wire connection on one board, so that it may be applied to various electronic devices having different connection structures. Accordingly, the number of parts to be managed by a factory that manufactures various electronic devices.

DETAILED DESCRIPTION

Hereinafter, various embodiments of the disclosure will hereinafter be described with reference to the accompanying drawings. However, it is to be understood that embodiments of the present disclosure are not limited to the described example embodiments, and include various modifications, equivalents, and/or alternatives according to embodiments of the disclosure. The matters defined herein, such as a detailed construction and elements thereof, are provided to assist in a comprehensive understanding of the present disclosure. Thus, it is apparent that example embodiments may be carried out without those defined matters. Also, well-known functions or constructions are omitted to provide a clear and concise description of example embodiments. Further, dimensions of various elements in the accompanying drawings may be arbitrarily increased or decreased for assisting in a comprehensive understanding.

The terms 'first', 'second', etc. may be used to describe diverse components, but the components are not limited by the terms. The terms may only be used to distinguish one component from the others. For example, without departing from the scope of the present disclosure, a first component may be referred to as a second component, and similarly, a second component may also be referred to as a first component.

Terms used in this disclosure are used only to describe specific embodiments, and may not be intended to limit the scope of other embodiments. The singular expression may include the plural expression unless the context clearly dictates otherwise. Terms used herein, including technical or scientific terms, may have the same meanings as commonly understood by one of ordinary skill in the art described in the disclosure. Among the terms used in this disclosure, terms defined in a general dictionary may be interpreted with the same or similar meaning as the meaning in the context of the related art, and may not be interpreted in an ideal or excessively formal meaning unless explicitly defined in this disclosure. In some cases, even terms defined in this disclosure cannot be construed to exclude embodiments of the disclosure.

Hereinafter, a wireless communication board according to certain embodiments of the disclosure will be described in detail with reference to the accompanying drawing.

Figure 1:
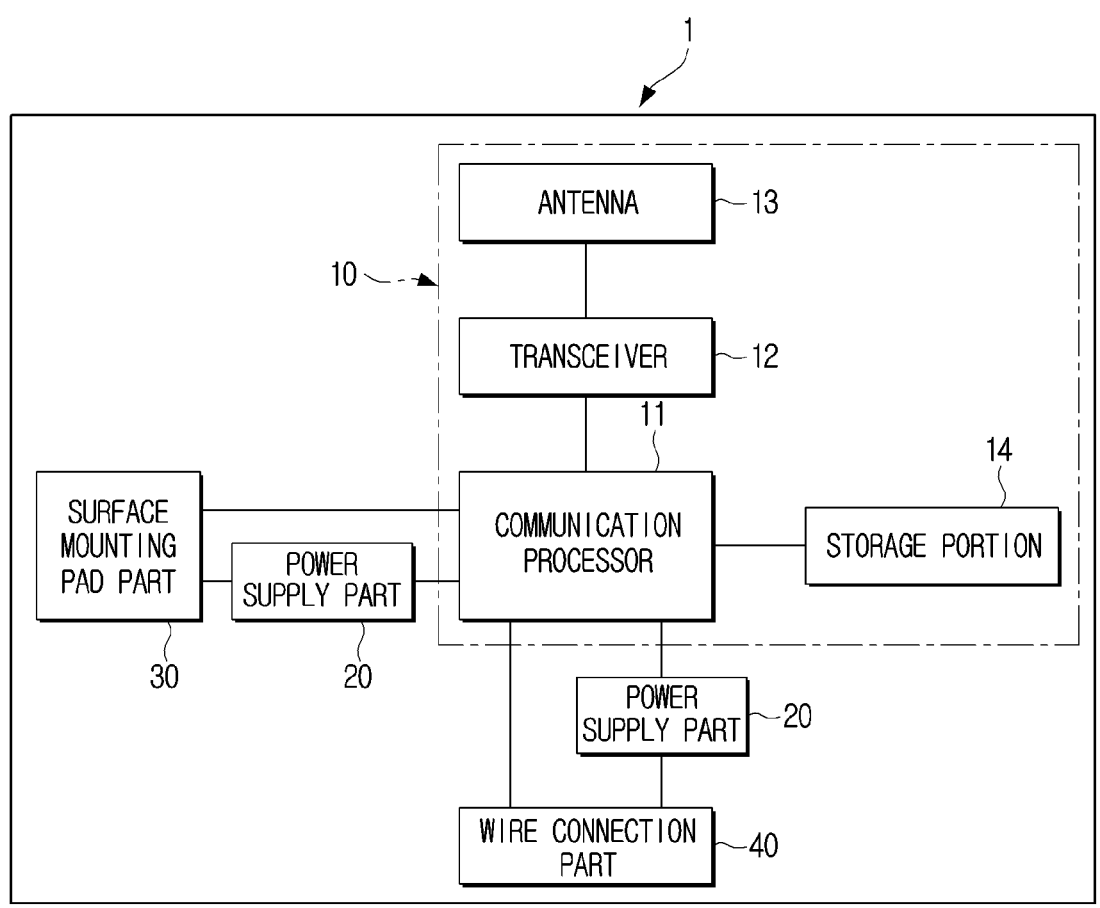
FIG. 1 is a functional block diagram of a wireless communication board according to various embodiments of the present disclosure.
Figure 2:
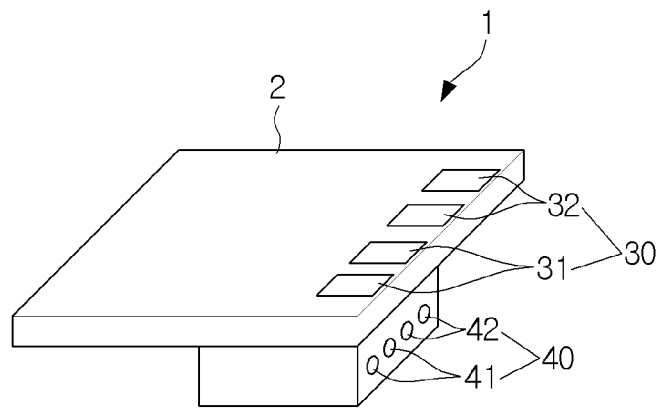
FIG. 2 is a perspective view conceptually illustrating a wireless communication board according to various embodiments of the present disclosure.

FIG. 1 is a functional block diagram of a wireless communication board according to various embodiments of the present disclosure. FIG. 2 is a perspective view conceptually illustrating a wireless communication board according to various embodiments of the present disclosure. For reference, a wireless communication part and a power supply are not shown in FIG. 2 for convenience of illustration.

Referring to FIGS. 1 and 2, a wireless communication board 1 according to certain embodiments of the disclosure may include a communication board 2, a wireless communication part 10, a power supply 20, a surface mounting pad 30, and a wire connection 40.

The wireless communication part 10, the power supply 20, the surface mounting pad 30, and the wire connection 40 are disposed on the top surface or the bottom surface of the communication board 2. The communication board 2 is provided with a circuit line configured to connect the wireless communication part 10, the power supply 20, the surface mounting pad 30, and the wire connection 40.

The wireless communication part 10 is disposed on one surface of the communication board 2, and may be configured to receive a signal from a main board 100 (see FIG. 3) and transmit the signal to an external device, for example, a mobile device such as a smartphone, and to receive a signal from the external device and transmit the signal to the main board 100.

The wireless communication part 10 is connected to the surface mounting pad 30 and the wire connection 40, so that the wireless communication part 10 may send and receive signals to and from the main board 100. In addition, the wireless communication part 10 is connected to the power supply 20 to receive power required for operation from the power supply 20.

The wireless communication part 10 may include a communication processor 11, a transceiver 12, an antenna 13, and a storage portion 14 disposed on the communication board 2 to perform wireless communication with the external device.

The communication processor 11 is connected to the surface mounting pad 30 and the wire connection 40 to transmit and receive signals. The communication processor 11 is connected to the transceiver 12 so as to transmit and receive signals. In addition, the communication processor 11 is configured to process and output the received signals.

Accordingly, the communication processor 11 may process a signal received through the surface mounting pad 30 or the wire connection 40 and output the processed signal to the transceiver 12. In addition, the communication processor 11 may process a signal received through the transceiver 12 and output the processed signal to the surface mounting pad 30 and the wire connection 40.

The transceiver 12 is connected to the communication processor 11 and the antenna 13 so as to output a signal received from the communication processor 11 to an external device through the antenna 13. In addition, the transceiver 12 is configured to process a signal from the external device received through the antenna 13 and output the processed signal to the communication processor 11.

The antenna 13 is configured to wirelessly transmit a signal output from the transceiver 12 to the external device, and to receive a signal wirelessly output from the external device and transmit it to the transceiver 12.

Accordingly, a signal output from the main board 100 may be input to the communication processor 11 through one of the surface mounting pad 30 and the wireless communication part 10. The signal input to the communication processor 11 is appropriately processed and wirelessly output through the transceiver 12 and the antenna 13. Then, the external device may recognize the signal of the main board 100 output from the wireless communication board 1.

When the external device wirelessly outputs a signal, the antenna 13 of the wireless communication part 10 receives the wireless signal and transmits it to the transceiver 12, and the transceiver 12 transmits the signal of the external device transmitted from the antenna 13 to the communication processor 11. Then, the communication processor 11 appropriately processes the input signal and outputs the processed signal to the surface mounting pad 30 and the wire connection 40.

The storage portion 14 is connected to the communication processor 11 and is configured to store signals received or generated by the communication processor 11.

The wireless communication part 10 operating in this way may be configured to satisfy various communication standards. For example, the wireless communication part 10 may be configured to implement at least one communication standard among WiFi, Zig bee, Z-wave, and Bluetooth.

The power supply 20 is disposed on the communication board 2, and is configured to receive power from the main board 100 and supply power to the wireless communication part 10.

The power supply 20 is connected to the surface mounting pad 30 and the wire connection 40 to receive power from the main board 100. In FIG. 1, the power supply 20 connected to the surface mounting pad 30 and the power supply 20 connected to the wire connection 40 are separately shown, but the two power supplies 20 in FIG. 1 may be formed as one. In other words, a single power supply 20 may be configured to be connected to the surface mounting pad 30 and the wire connection 40.

The surface mounting pad 30 is provided on the communication board 2 so as to be connected to the main board 100. The surface mounting pad 30 is provided to be connected to the wireless communication part 10 and the power supply 20 on one surface of the communication board 2, and may include a plurality of pads 31 and 32. The plurality of pads 31 and 32 may include signal transmission pads 31 and power supply pads 32. The signal transmission pads 31 may include at least two pads, and the power supply pads 32 may include a power pad and a ground pad. In other words, in this embodiment, the surface mounting pad 30 includes four pads 31 and 32. However, the signal transmission pads 31 may include three pads as needed. Accordingly, as another example, the surface mounting pad 30 may include five or more pads.

The signal transmission pads 31 are connected to the communication processor 11, and the power supply pads 32 are connected to the power supply 20. Accordingly, the signal of the main board 100 input to the signal transmission pads 31 may be transmitted to the communication processor 11. In addition, the power of the main board 100 input to the power supply pads 32 may be supplied to the power supply 20. The surface mounting pad 30 is provided on one surface of the communication board 2 so that the surface mounting pad 30 may be disposed on the main board 100 by surface mounting technology SMT.

The wire connection 40 is provided on the communication board 2 to be connected to the main board 100. The wire connection 40 is provided on one surface of the communication board 2 to be connected to the wireless communication part 10 and power supply 20. The wire connection 40 may be provided on a surface opposite to the one surface of the communication board 2 on which the surface mounting pad 30 is provided. The wireless communication part 10 may be provided on one surface of the communication board 2 on which the wire connection 40 is provided. Due to this configuration, when the surface mounting pad 30 is mounted on the main board 100, the wire connection 40 and the wireless communication part 10 do not interfere with the main board 100.

The wire connection 40 may be implemented as a connector including a plurality of terminals 41 and 42. The connector implementing the wire connection 40 may be a male connector or a female connector. The plurality of terminals 41 and 42 of the connector 40 may include signal transmission terminals 41 and power supply terminals 42. The signal transmission terminals 41 may include at least two terminals, and the power supply terminals 42 may include a power terminal and a ground terminal. The signal transmission terminals 41 may include three terminals as necessary. The signal transmission terminals 41 are connected to the communication processor 11, and the power supply terminals 42 are connected to the power supply 20. Accordingly, the signal of the main board 100 input to the signal transmission terminals 41 may be transmitted to the communication processor 11, and the power of the main board 100 input to the power supply terminals 42 may be supplied to the power supply 20.

Figure 6:
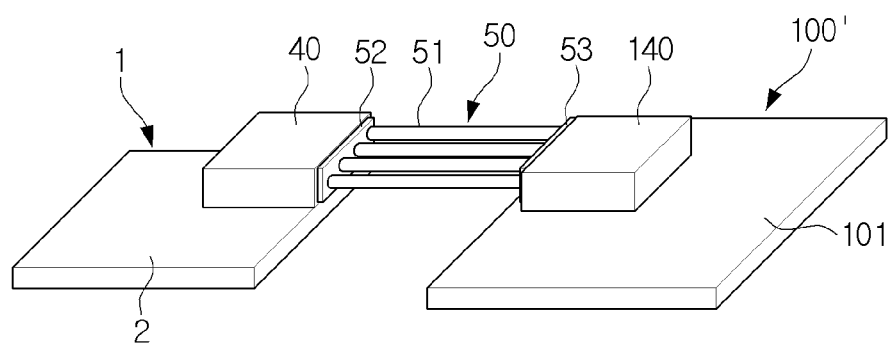
FIG. 6 is a perspective view conceptually illustrating a state in which a wireless communication board and the main board of FIG. 5 are connected with a connecting wire according to various embodiments of the present disclosure.

The wire connection 40 is connected to the main board 100 through a connection wire 50 (see FIG. 6). The connection wire 50 includes a wire 51 and connectors 52 and 53 provided at both ends of the wire 51. Here, the wire 51 refers to an electric cable capable of transmitting power and signals. The connector 52 of the connection wire 50 is determined according to the connector implementing the wire connection 40. For example, when the wire connection 40 is formed as a male connector, the connector 52 of the connection wire 50 to be coupled to the wire connection 40 is provided as a female connector. Conversely, when the wire connection 40 is formed as a female connector, the connector 52 of the connection wire 50 is provided as a male connector.

Hereinafter, the main board 100 of the electronic device to which the wireless communication board 1 having the above-described structure is connected will be described with reference to FIGS. 3 and 4. For reference, in the following description, the main board 100 may include various electronic circuit boards of electronic devices to which the wireless communication board 1 may be connected according to certain embodiments.

Figure 3:
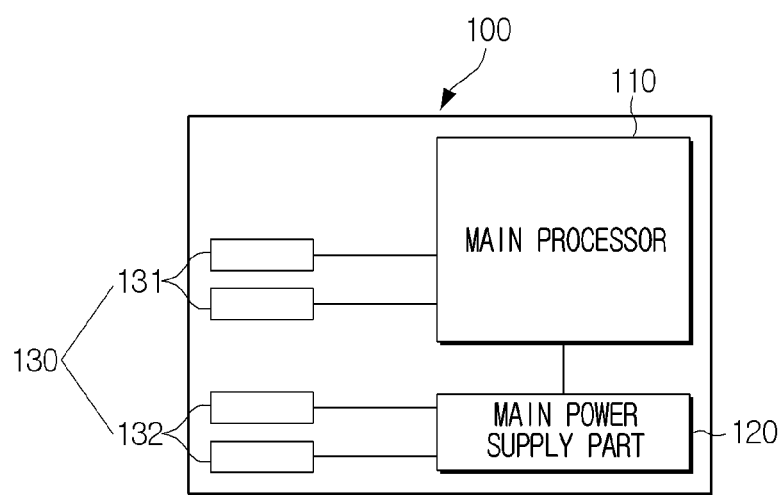
FIG. 3 is a functional block diagram illustrating an example of a main board to which a wireless communication board is connected according to various embodiments of the present disclosure.
Figure 4:
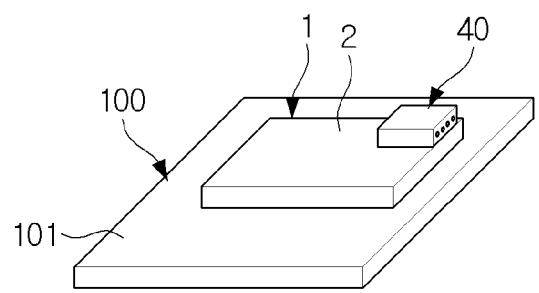
FIG. 4 is a perspective view conceptually illustrating a state in which a wireless communication board and the main board of FIG. 3 are connected with a surface mounting pad according to various embodiments of the present disclosure.

FIG. 3 is a functional block diagram illustrating an example of a main board to which a wireless communication board is connected according to various embodiments of the present disclosure, and FIG. 4 is a perspective view conceptually illustrating a state in which a wireless communication board and the main board of FIG. 3 are connected with a surface mounting pad according to various embodiments of the present disclosure.

Referring to FIGS. 3 and 4, the main board 100 to which the wireless communication board 1 according to certain embodiments is connected may include a main circuit board 101, a main processor 110, a main power supply 120, and a communication connection 130.

The main processor 110, the main power supply 120, and the communication connection 130 are disposed on the upper surface or the lower surface of the main circuit board 101. A circuit line connecting the main processor 110, the main power supply 120, and the communication connection 130 is provided on the main circuit board 101.

The main processor 110 may be configured to control the operation of the electronic device in which the wireless communication board 1 according to certain embodiments is used. The main processor 110 may be implemented as a single electronic component in which various electronic components are integrated. Alternatively, the main processor 110 may be implemented as an electronic circuit composed of various electronic components. The main processor 110 may include control programs capable of controlling the operation of the electronic device.

The main processor 110 may be configured to control the electronic device as a whole. For example, the main processor 110 may be implemented as a central controller that controls the entire electronic device. Alternatively, the main processor 110 may be configured to partially control the electronic device. For example, the main processor 110 may be implemented as an interface controller of an operation panel that receives a user's command and transmits it to the central controller of the electronic device.

Accordingly, the main board 100 of this disclosure may be implemented as a central control board including a central controller capable of controlling an electronic device such as a refrigerator, a washing machine, an oven, and the like as a whole. As another example, the main board 100 may be implemented as an operation panel board including an interface controller of an operation panel provided to allow a user to manipulate an electronic device such as a refrigerator, a washing machine, an oven, and the like.

The main power supply 120 may be configured to receive power from the outside and supply power to the main processor 110 and the wireless communication board 1. The main power supply 120 is connected to the communication connection 130 to supply power to the wireless communication board 1.

The communication connection 130 is provided on the main board 100 to be connected to the wireless communication board 1. The communication connection 130 may include a plurality of signal lines 131 connected to the main processor 110 and a plurality of power lines 132 connected to the main power supply 120.

The communication connection 130 is formed as a plurality of pads 131 and 132 so as to be connected to the surface mounting pad 30 of the wireless communication board 1 by surface mounting technology. The plurality of pads 131 and 132 of the communication connection 130 are formed to correspond to the plurality of pads 31 and 32 of the surface mounting pad 30 of the wireless communication board 1.

The plurality of pads 131 and 132 of the communication connection 130 are provided on one surface of the main circuit board 101 to be connected to the main processor 110 and the main power supply 120. The plurality of pads 131 and 132 may include signal transmission pads 131 and power supply pads 132. The signal transmission pads 131 may include at least two pads, and the power supply pads 132 may include a power pad and a ground pad. In other words, in this embodiment, the communication connection 130 includes four pads. However, the signal transmission pads 131 may include three pads as needed. Accordingly, as another example, the communication connection 130 may include five or more pads.

The signal transmission pads 131 are connected to the main processor 110, and the power supply pads 132 are connected to the main power supply 120. Accordingly, the signal of the main processor 110 input to the signal transmission pads 131 may be transmitted to the wireless communication board 1. In addition, the power of the main power supply 120 input to the power supply pads 132 may be supplied to the power supply 20 of the wireless communication board 1.

As illustrated in FIG. 4, the wireless communication board 1 according to certain embodiments may be disposed on the main board 100 by surface mounting technology. In detail, the plurality of pads 31 and 32 of the surface mounting pad 30 of the wireless communication board 1 and the plurality of pads 131 and 132 of the communication connection 130 of the main board 100 are disposed to be in contact with each other, and are fixed by soldering.

Then, the communication processor 11 of the wireless communication board 1 is connected to the main processor 110 of the main board 100 through the surface mounting pad 30 and the communication connection 130. Accordingly, under the control of the main processor 110 of the main board 100, the wireless communication board 1 may wirelessly transmit a signal to an external device, and transmit a signal input from the external device to the main processor 110 of the main board 100.

In addition, the power supply 20 of the wireless communication board 1 is also connected to the main power supply 120 of the main board 100 through the surface mounting pad 30 and the communication connection 130. Accordingly, the wireless communication board 1 may operate by receiving power from the main board 100.

Hereinafter, another example of a main board of an electronic device to which a wireless communication board having the above structure is connected will be described with reference to FIGS. 5 and 6. For reference, in the following description, the main board may include various electronic circuit boards of electronic devices to which the wireless communication board according to certain embodiments may be connected.

Figure 5:
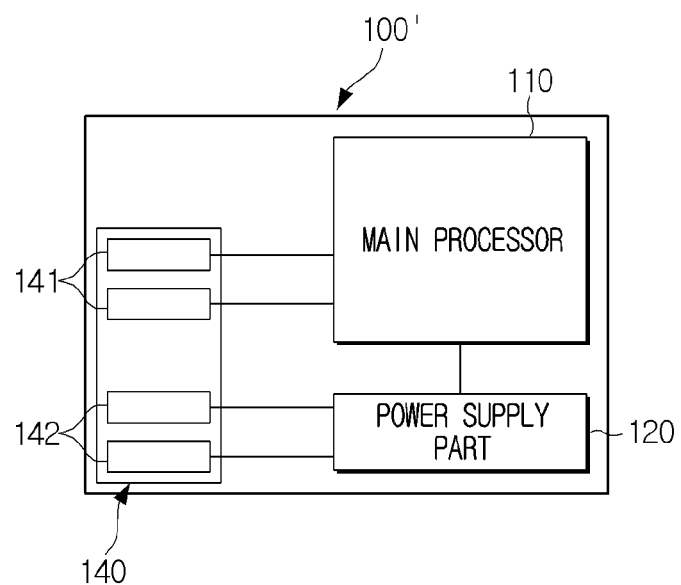
FIG. 5 is a functional block diagram illustrating another example of a main board to which a wireless communication board is connected according to embodiments of the present disclosure.

FIG. 5 is a functional block diagram illustrating another example of a main board to which a wireless communication board is connected according to various embodiments of the present disclosure. FIG. 6 is a perspective view conceptually illustrating a state in which a wireless communication board and the main board of FIG. 5 are connected with a connecting wire according to various embodiments of the present disclosure.

Referring to FIGS. 5 and 6, a main board 100' to which the wireless communication board 1 according to certain embodiments is connected may include a main circuit board 101, a main processor 110, a main power supply 120, and a communication connection 140.

The main processor 110, the main power supply 120, and the communication connection 140 are disposed on the upper surface or the lower surface of the main circuit board 101. A circuit line connecting the main processor 110, the main power supply 120, and the communication connection 140 is provided on the main circuit board 101.

The main processor 110 may be configured to control the operation of the electronic device in which the wireless communication board 1 according to certain embodiments is used. The main processor 110 may be implemented as a single electronic component in which various electronic components are integrated. Alternatively, the main processor 110 may be implemented as an electronic circuit composed of various electronic components. The main processor 110 may include control programs capable of controlling the operation of the electronic device.

The main processor 110 may be configured to control the electronic device as a whole. For example, the main processor 110 may be implemented as a central controller that controls the entire electronic device. Alternatively, the main processor 110 may be configured to partially control the electronic device. For example, the main processor 110 may be implemented as an interface controller of an operation panel that receives a user's command and transmits it to the central controller of the electronic device.

Accordingly, as an example, the main board 100' of this disclosure may be implemented as a central control board including a central controller capable of controlling an electronic device such as a refrigerator, a washing machine, an oven, and the like as a whole. As another example, the main board 100' may be implemented as an operation panel board disposed inside an operation panel, which is provided to allow a user to manipulate an electronic device such as a refrigerator, a washing machine, an oven, and the like, and including an interface controller.

The main power supply 120 may be configured to receive power from the outside and supply power to the main processor 110 and the wireless communication board 1. The main power supply 120 is connected to the communication connection 140 to supply power to the wireless communication board 1.

The communication connection 140 is provided on the main circuit board 101 to be connected to the wireless communication board 1. The communication connection 140 may include a plurality of signal lines 141 connected to the main processor 110 and a plurality of power lines 142 connected to the main power supply 120.

The communication connection 140 may be implemented as a connector including a plurality of terminals to be connected to the wire connection 40 of the wireless communication board 1 with a wire.

The connector implementing the communication connection 140 may be a male connector or a female connector. The plurality of terminals of the connector 140 may include signal transmission terminals 141 and power supply terminals 142. The signal transmission terminals 141 may include at least two terminals, and the power supply terminals 142 may include a power terminal and a ground terminal. In other words, in this embodiment, the connector of the communication connection 140 includes four terminals 141 and 142. However, the signal transmission terminals 141 may include three terminals as necessary. Accordingly, as another example, the connector of the communication connection 140 may include five or more terminals.

The signal transmission terminals 141 are connected to the main processor 110, and the power supply terminals 142 are connected to the main power supply 120. Accordingly, the signal of the main processor 110 input to the signal transmission terminals 141 may be transmitted to the communication processor 11 of the wireless communication board 1, and the power of the main power supply 120 input to the power supply terminals 142 may be supplied to the power supply 20 of the wireless communication board 1.

The connector implementing the communication connection 140 is connected to the wire connection 40 of the wireless communication board 1 through a connection wire 50. The connector 53 of the connection wire 50 to be coupled to the connector of the communication connection 140 is determined according to the connector implementing the communication connection 140. For example, when the communication connection 140 is formed as a male connector, the connector 53 of the connection wire 50 to be coupled to the communication connection 140 is formed as a female connector. Conversely, when the communication connection 140 is formed as a female connector, the connector 53 of the connection wire 50 is formed as a male connector.

As illustrated in FIG. 6, the wireless communication board 1 according to certain embodiments may be connected to the main board 100' with the connection wire 50. In detail, the connector of the wire connection 40 of the wireless communication board 1 and the connector of the communication connection 140 of the main board 100' are connected by the connection wire 50.

Then, the communication processor 11 of the wireless communication board 1 is connected to the main processor 110 of the main board 100' through the wire connection 40 and the communication connection 140. Accordingly, under the control of the main processor 110 of the main board 100', the wireless communication board 1 may wirelessly transmit a signal to an external device, and transmit a signal received from the external device to the main processor 110 of the main board 100'.

In addition, the power supply 20 of the wireless communication board 1 is also connected to the main power supply 120 of the main board 100' through the wire connection 40 and the communication connection 140. Accordingly, the wireless communication board 1 may operate by receiving power from the main board 100'.

Hereinafter, a wireless communication board according to certain embodiments including a wire connection having a different structure will be described with reference to FIGS. 7 and 8.

Figure 7:
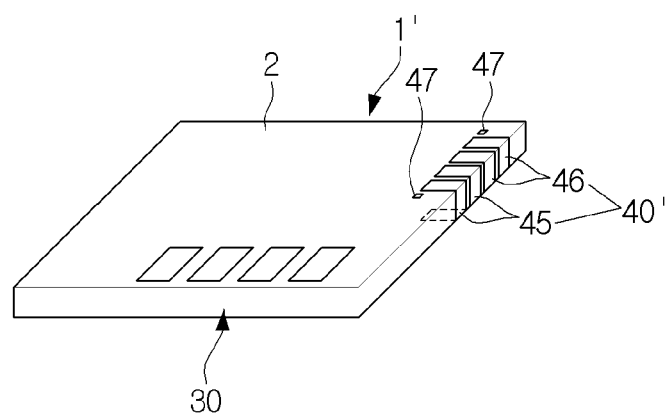
FIG. 7 is a perspective view conceptually illustrating another example of a wireless communication board according to various embodiments of the present disclosure.
Figure 8:
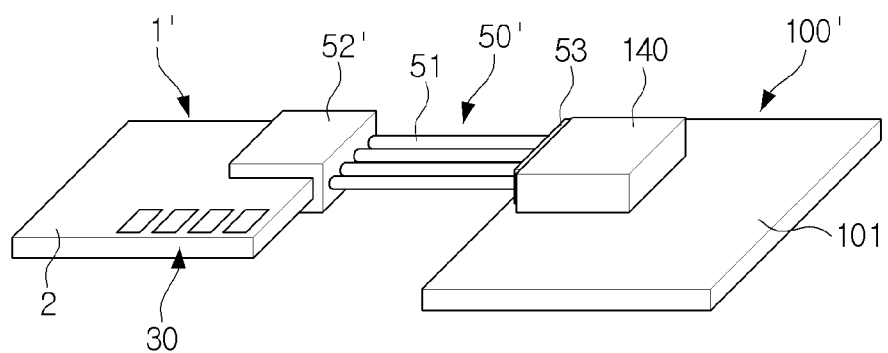
FIG. 8 is a perspective view conceptually illustrating a state in which the wireless communication board of FIG. 7 and the main board of FIG. 3 are connected to each other with a connecting wire according to embodiments of the present disclosure.

FIG. 7 is a perspective view conceptually illustrating another example of a wireless communication board according to various embodiments of the present disclosure, and FIG. 8 is a perspective view conceptually illustrating a state in which the wireless communication board of FIG. 7 and the main board of FIG. 3 are connected with a connecting wire according to various embodiments of the present disclosure.

Referring to FIG. 7, a wireless communication board 1' according to certain embodiments may include a communication board 2, a wireless communication part 10 (see FIG. 1), a power supply 20 (see FIG. 1), a surface mounting pad 30, and a wire connection 40'.

The communication board 2, the wireless communication part 10, the power supply 20, and the surface mounting pad 30 are the same as those of the wireless communication board 1 as illustrated in FIG. 2; therefore, detailed descriptions thereof are omitted.

The wire connection 40' is provided on the communication board 2 to be connected to the main board 100. The wire connection 40' is provided on one surface of the communication board 2 to be connected to the wireless communication part 10 and power supply 20. The wire connection 40' may be provided on the communication board 2 on one side of the surface mounting pad 30.

The wire connection 40' may include a plurality of contacts 45 and 46 and connector couplings 47 formed on the edge of the communication board 2. Each of the plurality of contacts 45 and 46 may be formed in a band shape extending along the upper surface, the side surface, and the lower surface of the communication board 2 as illustrated in FIG. 7. Accordingly, a contact portion having the same shape as a contact portion formed on the upper surface may be provided on the lower surface of the communication board 2.

The plurality of contacts 45 and 46 may include signal transmission contacts 45 and power supply contacts 46. The signal transmission contacts 45 may include at least two contacts, and the power supply contacts 46 may include a power contact and a ground contact. The signal transmission contacts 45 may include three contacts as necessary. The signal transmission contacts 45 are connected to the main processor 110, and the power supply contacts 46 are connected to the power supply 20. Accordingly, the signal of the main board 100' input to the signal transmission contacts 45 may be transmitted to the communication processor 11, and the power of the main board 100' input to the power supply contacts 46 may be supplied to the power supply 20.

The connector couplings 47 may be formed to be coupled with a connector 52' of a connection wire 50' having a plurality of corresponding contacts that are in contact with the plurality of contacts 45 and 46 of the wire connection 40'. Therefore, the connector 52' of the connection wire 50' for connecting the wireless communication board 1' according to this embodiment to the main board 100' is different from the connector 52 of the connection wire 50 described above.

The connector 52' of the connection wire 50' coupled to the wire connection 40' of the wireless communication board 1' according to this embodiment is formed as a board insertion connector into which the edge of the communication board 1' may be inserted. In other words, the board insertion connector 52' is formed in a substantially U-shape with a flat bottom. In addition, the board insertion connector 52' includes the plurality of corresponding contacts that are in contact with the plurality of contacts 45 and 46 of the wire connection 40' and corresponding coupling parts that are coupled to the connector couplings 47 of the wire connection 40'. Therefore, when the plurality of contacts 45 and 46 of the wire connection 40' of the wireless communication board 1' are inserted into the board insertion connector 52' of the connection wire 50', the connection wire 50' is electrically connected to the plurality of contacts 45 and 46. The connector 53 provided at the other end of the connection wire 50' is the same as the connector 53 of the connection wire 50 as described above.

As illustrated in FIG. 8, the wireless communication board 1' according to certain embodiments shown in FIG. 7 may be connected to the main board 100' with the connection wire 50'. In detail, the plurality of contacts 45 and 46 of the wire connection 40' of the wireless communication board 1' and the connector of the communication connection 140 of the main board 100' are connected with the connection wire 50'. In this case, the main board 100' is the same as the main board 100' shown in FIG. 3; therefore, a detailed description thereof is omitted.

Then, the communication processor 11 of the wireless communication board 1' is connected to the main processor 110 of the main board 100' through the wire connection 40' and the communication connection 140. Accordingly, under the control of the main processor 110 of the main board 100', the wireless communication board 1' may wirelessly transmit a signal to an external device, and transmit a signal received from the external device to the main processor 110 of the main board 100'.

In addition, the power supply 20 of the wireless communication board 1' is also connected to the main power supply 120 of the main board 100' through the wire connection 40' and the communication connection 140. Accordingly, the wireless communication board 1' may operate by receiving power from the main board 100'.

Hereinafter, a wireless communication board according to certain embodiments including a surface mounting pad having a different structure will be described with reference to FIGS. 9 and 10.

Figure 9:
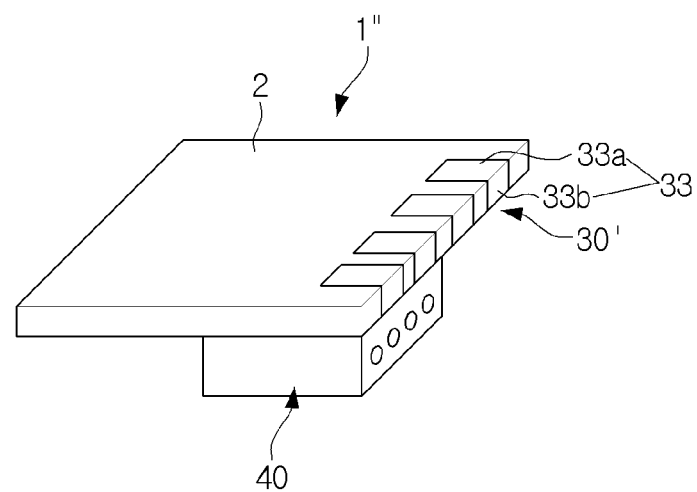
FIG. 9 is a perspective view conceptually illustrating another example of a wireless communication board according to various embodiments of the present disclosure.
Figure 10:
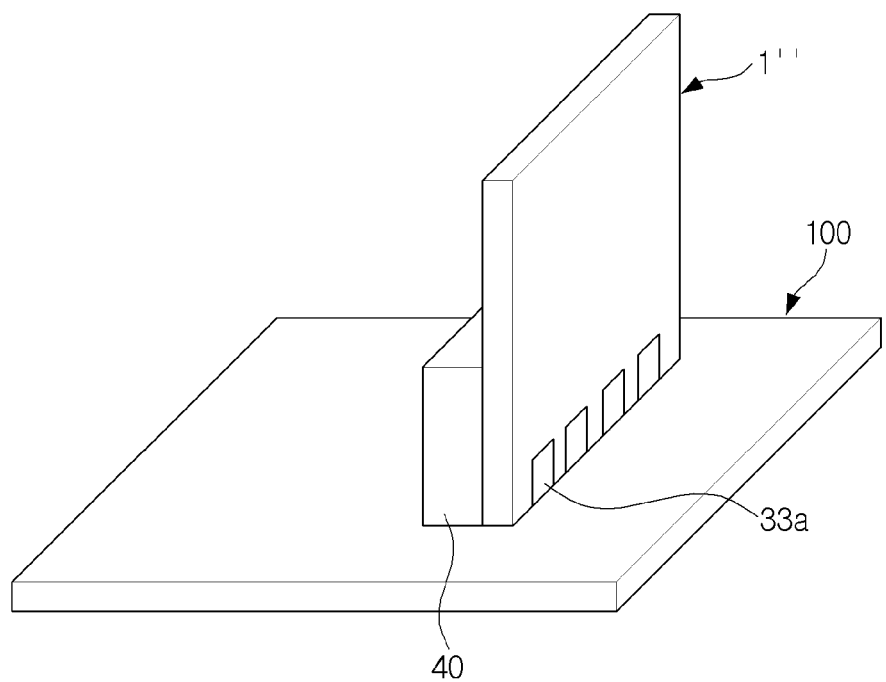
FIG. 10 is a perspective view conceptually illustrating a state in which the wireless communication board of FIG. 9 and a main board are connected with a surface mounting pad according to various embodiments of the present disclosure.

FIG. 9 is a perspective view conceptually illustrating another example of a wireless communication board according to various embodiments of the present disclosure, and FIG. 10 is a perspective view conceptually illustrating a state in which the wireless communication board of FIG. 9 and the main board are connected with a surface mounting pad according to various embodiments of the present disclosure.

Referring to FIG. 9, a wireless communication board 1" according to certain embodiments may include a communication board 2, a wireless communication part 10 (see FIG. 1), a power supply 20 (see FIG. 2), a surface mounting pad 30', and a wire connection 40.

The communication board 2, the wireless communication part 10, the power supply 20, and the wire connection 40 are the same as those of the wireless communication board 1 as illustrated in FIG. 2; therefore, detailed descriptions thereof are omitted.

The surface mounting pad 30' is similar to the surface mounting pad 30 of the wireless communication board 1 shown in FIG. 2. However, the surface mounting pad 30' according to this embodiment is different in that a plurality of pads 33 are formed to extend to the side surface of the communication board 2. In other words, each of the plurality of pads 33 includes an upper pad 33a formed on the upper surface of the communication board 2 and a side pad 33b formed on the side surface of the communication board 2.

The wireless communication board 1" including the plurality of pads 33 having the above-described structure may be disposed vertically on the main board 100 as illustrated in FIG. 10. In detail, the plurality of side pad portions 33b formed on the side surface of the wireless communication board 1" may be fixed to the plurality of pads of the communication connection 130 of the main board 100 by surface mounting technology. Then, the installation area of the wireless communication board 1" may be reduced. Therefore, there is an advantage that interference with other electronic components disposed on the main board 100 may be avoided.

Hereinafter, a wireless communication board according to another embodiment will be described in detail with reference to FIGS. 11 and 12.

Figure 11:
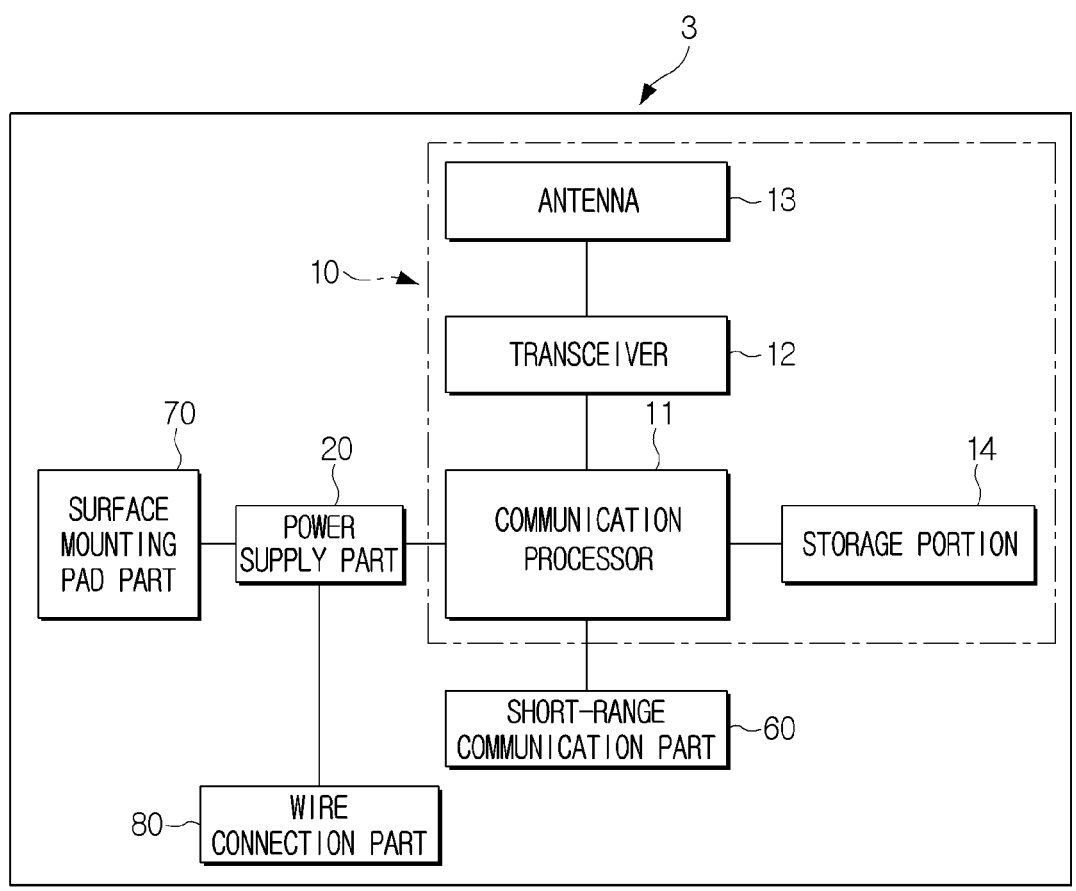
FIG. 11 is a functional block diagram of a wireless communication board according to various embodiments of the present disclosure.

FIG. 11 is a functional block diagram of a wireless communication board according to various embodiments of the present disclosure. FIG. 12 is a perspective view conceptually illustrating a wireless communication board according to various embodiments of the present disclosure.

Figure 12:
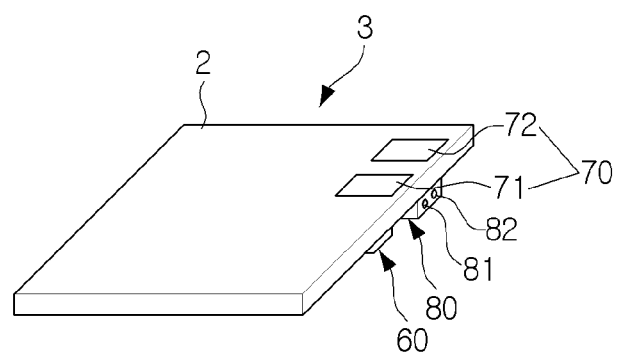
FIG. 12 is a perspective view conceptually illustrating a wireless communication board according to various embodiments of the present disclosure.

Referring to FIGS. 11 and 12, a wireless communication board 3 according to certain embodiments may include a communication board 2, a wireless communication part 10, a power supply 20, a short-range communication part 60, a surface mounting pad 70, and a wire connection 80.

The wireless communication part 10, the power supply 20, the short-range communication part 60, the surface mounting pad 70, and the wire connection 80 are disposed on the upper surface or the lower surface of the communication board 2. The communication board 2 is provided with a circuit line configured to connect the wireless communication part 10, the power supply 20, the short-range communication part 60, the surface mounting pad 70, and the wire connection 80.

The wireless communication part 10 is disposed on one surface of the communication board 2, and may be configured to receive a signal from a main board 200 (see FIG. 14) and transmit the signal to an external device, for example, a mobile device such as a smartphone and to receive a signal from the external device and transmit the signal to the main board 200.

The wireless communication part 10 is connected to the short-range communication part 60, so that the wireless communication part 10 may send and receive signals to and from the main board 200. In addition, the wireless communication part 10 is connected to the power supply 20 to receive power required for operation from the power supply 20.

The wireless communication part 10 may include a communication processor 11, a transceiver 12, an antenna 13, and a storage portion 14 disposed on the communication board 2 to perform wireless communication with the external device.

The communication processor 11 is connected to the short-range communication part 60 to transmit and receive signals. The communication processor 11 is connected to the transceiver 12 so as to transmit and receive signals. In addition, the communication processor 11 is configured to process and output the received signals.

Accordingly, the communication processor 11 may process a signal received through short-range communication part 60 and output the processed signal to the transceiver 12. In addition, the communication processor 11 may process a signal received through the transceiver 12 and output the processed signal to the short-range communication part 60.

The transceiver 12 is disposed between the communication processor 11 and the antenna 13, and is configured to output a signal received from the communication processor 11 to an external device through the antenna 13. In addition, the transceiver 12 is configured to process a signal from the external device received through the antenna 13 and output the processed signal to the communication processor 11.

The antenna 13 is configured to wirelessly transmit a signal output from the transceiver 12 to the external device, and to receive a signal wirelessly output from the external device and transmit the received signal to the transceiver 12.

Accordingly, a signal output from the main board 200 may be input to the communication processor 11 through the short-range communication part 60. The signal input to the communication processor 11 is appropriately processed and output as a radio signal through the transceiver 12 and the antenna 13. Then, the external device may recognize the signal of the main board 200 output from the wireless communication board 3.

When the external device wirelessly outputs a signal, the antenna 13 of the wireless communication part 10 receives the wireless signal and transmits the received signal to the transceiver 12. The transceiver 12 transmits the signal of the external device input from the antenna 13 to the communication processor 11. Then, the communication processor 11 appropriately processes the input signal and outputs the processed signal to the short-range communication part 60.

The storage portion 14 is connected to the communication processor 11 and is configured to store signals received or generated by the communication processor 11.

The wireless communication part 10 operating in this way may be configured to satisfy various communication standards. For example, the wireless communication part 10 may be configured to implement at least one communication standard among WiFi, Zig bee, Z-wave, and Bluetooth.

The power supply 20 is disposed on the communication board 2, and is configured to receive power from the main board 200, and to supply power to the wireless communication part 10.

The power supply 20 is connected to the surface mounting pad 70 and the wire connection 80 to receive power from the main board 200.

The short-range communication part 60 is connected to the wireless communication part 10, and is configured to transmit and receive signals to and from a main short-range communication part 260 provided on the main board 200. The short-range communication part 60 may be configured to communicate in a narrower area than an area in which the wireless communication part 10 of the wireless communication board 3 may communicate wirelessly with an external device. For example, the short-range communication part 60 may be configured to implement at least one communication standard among a radio frequency identification RFID, near field communication NFC, and infrared ray communication.

The surface mounting pad 70 is provided on the communication board 2 to be connected to the main board 200. The surface mounting pad 70 is provided to be connected to the power supply 20 on one surface of the communication board 2, and may include a plurality of pads 71 and 72. The plurality of pads may include a power pad 71 and a ground pad 72 to supply power. In other words, in this embodiment, the surface mounting pad 70 includes two pads 71 and 72. The surface mounting pad 70 is provided on one surface of the communication board 2 so that the surface mounting pad 70 may be disposed on the main board 200 by surface mounting technology.

The wire connection 80 is provided on the communication board 2 to be connected to the main board 200. The wire connection 80 is provided to be connected to the power supply 20 on one surface of the communication board 2. The wire connection 80 may be provided on a surface opposite to the one surface of the communication board 2 on which the surface mounting pad 70 is provided. The wireless communication part 10 may be provided on one surface of the communication board 2 on which the wire connection 80 is provided. Due to this configuration, when the surface mounting pad 70 is mounted on the main board 200, the wire connection 80 and the wire connection 80 do not interfere with the main board 200.

The wire connection 80 may be implemented as a connector including a plurality of terminals 81 and 82. The connector implementing the wire connection 40 may be a male connector or a female connector. The plurality of terminals of the connector 80 may include a power terminal 81 and a ground terminal 82 for supplying power. Accordingly, the power of the main board 200 input to the plurality of terminals 81 and 82 of the connector 80 may be supplied to the power supply 20.

Figure 16:
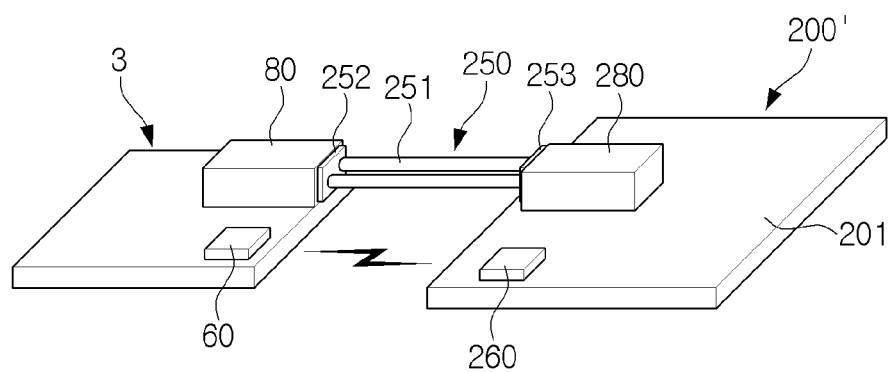
FIG. 16 is a perspective view conceptually illustrating a state in which a wireless communication board and the main board of FIG. 15 are connected to each other with a connecting wire according to various embodiments of the present disclosure.

The wire connection 80 is connected to the main board 200' through a connection wire 250 (see FIG. 16). The connection wire 250 includes a wire 251 and connectors 252 and 253 provided at both ends of the wire 251. Here, the wire 251 refers to an electric cable capable of transmitting power and signals. The connector 252 of the connection wire 250 is determined according to the connector implementing the wire connection 80. For example, when the wire connection 80 is formed as a male connector, the connector 252 of the connection wire 250 to be coupled to the wire connection 80 is provided as a female connector. Conversely, when the wire connection 80 is formed as a female connector, the connector 252 of the connection wire 250 to be connected to the wire connection 80 is formed as a male connector.

As another example, the wire connection 80 may be formed as a plurality of contacts and connector couplings as illustrated in FIG. 7. However, in the plurality of contacts of the FIG. 7, the signal transmission contacts are excluded, and the power contact and the ground contact are included.

Hereinafter, the main board 200 of the electronic device to which the wireless communication board 3 having the above-described structure is connected will be described with reference to FIGS. 13 and 14. For reference, in the following description, the main board 200 may include various electronic circuit boards of electronic devices to which the wireless communication board 3 according to certain embodiments may be connected.

Figure 13:
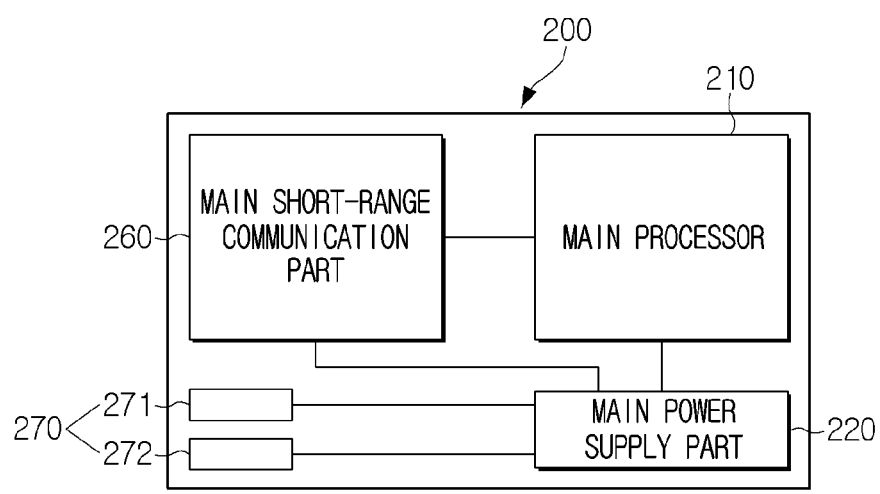
FIG. 13 is a functional block diagram illustrating an example of a main board to which a wireless communication board is connected.
Figure 14:
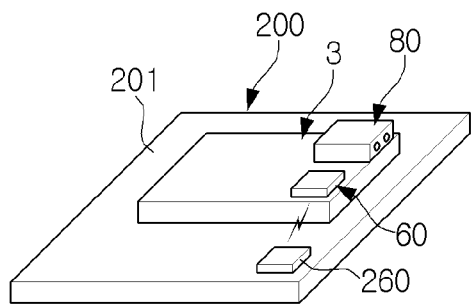
FIG. 14 is a perspective view conceptually illustrating a state in which a wireless communication board and the main board of FIG. 13 are connected with a surface mounting pad according to various embodiments of the present disclosure.

FIG. 13 is a functional block diagram illustrating an example of a main board to which a wireless communication board is connected according to various embodiments of the present disclosure, and FIG. 14 is a perspective view conceptually illustrating a state in which a wireless communication board and the main board of FIG. 13 are connected with a surface mounting pad according to various embodiments of the present disclosure.

Referring to FIGS. 13 and 14, the main board 200 to which the wireless communication board 3 according to certain embodiments is connected may include a main circuit board 201, a main processor 210, a main power supply 220, a main short-range communication part 260, and a communication connection 270.

The main processor 210, the main power supply 220, the main short-range communication part 260, and the communication connection 270 are disposed on the upper surface or the lower surface of the main circuit board 201. A circuit line connecting the main processor 210, the main power supply 220, the main short-range communication part 260, and the communication connection 270 is provided on the main circuit board 201.

The main processor 210 may be configured to control the operation of the electronic device in which the wireless communication board 3 according to certain embodiments is used. The main processor 210 may be implemented as a single electronic component in which various electronic components are integrated. Alternatively, the main processor 210 may be implemented as an electronic circuit composed of various electronic components. The main processor 210 may include control programs capable of controlling the operation of the electronic device.

The main processor 210 is the same as or similar to the main processor 110 of the main board 100 except that the main processor 210 is configured to control the main short-range communication part 260 to transmit and receive signals to and from the wireless communication board 3. Therefore, a detailed description thereof is omitted.

The main power supply 220 may be configured to receive power from the outside and to supply power to the main processor 210, the main short-range communication part 260, and the wireless communication board 3. The main power supply 220 is connected to the communication connection 270 to supply power to the wireless communication board 3.

The main short-range communication part 260 is connected to the main processor 210, and is configured to transmit and receive signals to and from the short-range communication part 60 provided on the wireless communication board 3. The main short-range communication part 260 may be configured to communicate in a narrower area than an area in which the wireless communication part 10 of the wireless communication board 3 may communicate wirelessly with an external device. For example, the main short-range communication part 260 may be configured to implement at least one communication standard among a radio frequency identification RFID, near field communication NFC, and infrared ray communication like the short-range communication part 60 of the wireless communication board 3.

The communication connection 270 is provided on the main circuit board 201 to be connected to the wireless communication board 3. The communication connection 270 may include a plurality of pads 271 and 272 so as to be connected to the surface mounting pad 70 of the wireless communication board 3 by surface mounting technology. The plurality of pads 271 and 272 of the communication connection 270 are formed to correspond to the plurality of pads 71 and 72 of the surface mounting pad 70 of the wireless communication board 3.

The plurality of pads 271 and 272 of the communication connection 270 are provided on one surface of the main circuit board 201 to be connected to the main power supply 220. The plurality of pads 271 and 272 may include a power pad 271 and a ground pad 272 for supplying power. In other words, in this embodiment, the communication connection 270 includes two pads 271 and 272.

As illustrated in FIG. 14, the wireless communication board 3 according to certain embodiments may be disposed on the main board 200 by surface mounting technology. In detail, the plurality of pads 71 and 72 of the surface mounting pad 70 of the wireless communication board 3 and the plurality of pads 271 and 272 of the communication connection 270 of the main board 200 are disposed to contact each other and are fixed by soldering.

Then, the power supply 20 of the wireless communication board 3 is connected to the main power supply 220 of the main board 200 through the surface mounting pad 70 and the communication connection 270. Accordingly, the wireless communication board 3 may operate by receiving power from the main board 200.

The communication processor 11 of the wireless communication board 3 is connected to the main processor 210 of the main board 200 through the short-range communication part 60 and the main short-range communication part 260. Accordingly, under the control of the main processor 210 of the main board 200, the wireless communication board 3 may wirelessly transmit a signal to an external device, and transmit a signal input from the external device to the main processor 210 of the main board 200.

Hereinafter, another example of a main board 200' of an electronic device to which the wireless communication board 3 having the above structure is connected will be described with reference to FIGS. 15 and 16. For reference, in the following description, the main board 200' may include various electronic circuit boards of electronic devices to which the wireless communication board 3 according to certain embodiments may be connected.

Figure 15:
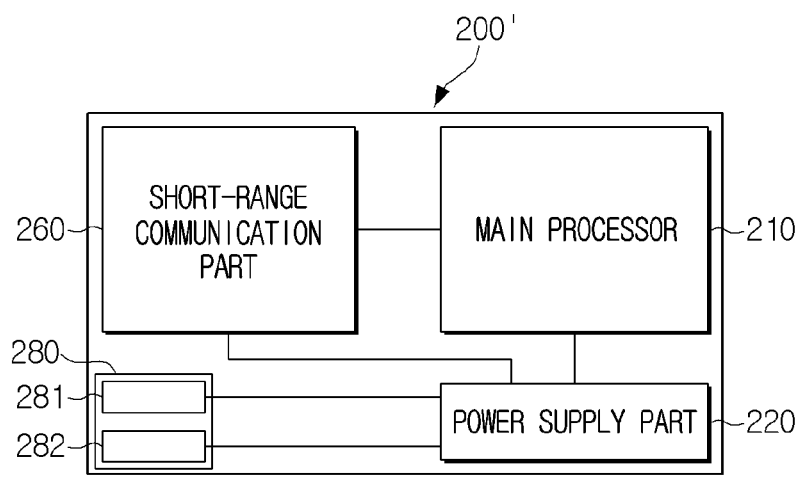
FIG. 15 is a functional block diagram illustrating another example of a main board to which a wireless communication board is connected according to various embodiments of the present disclosure.

FIG. 15 is a functional block diagram illustrating another example of a main board to which a wireless communication board is connected according to various embodiments of the present disclosure, and FIG. 16 is a perspective view conceptually illustrating a state in which a wireless communication board and the main board of FIG. 15 are connected with a connecting wire according to various embodiments of the present disclosure.

Referring to FIGS. 15 and 16, the main board 200' to which the wireless communication board 3 according to certain embodiments is connected may include a main circuit board 201, a main processor 210, a main power supply 220, a main short-range communication part 260, and a communication connection 280.

The main processor 210, the main power supply 220, the main short-range communication part 260, and the communication connection 280 are disposed on the upper surface or the lower surface of the main circuit board 201. A circuit line connecting the main processor 210, the main power supply 220, the main short-range communication part 260, and the communication connection 280 is provided on the main circuit board 201.

The main processor 210 may be configured to control the operation of the electronic device in which the wireless communication board 3 according to certain embodiments is used. The main processor 210 may be implemented as a single electronic component in which various electronic components are integrated. Alternatively, the main processor 210 may be implemented as an electronic circuit composed of various electronic components. The main processor 210 may include control programs capable of controlling the operation of the electronic device.

The main processor 210 is the same as or similar to the main processor 210 according to the above-described embodiment except that the main processor 210 is configured to control the main short-range communication part 260 to transmit and receive signals to and from the wireless communication board 3. Therefore, a detailed description thereof is omitted.

The main power supply 220 may be configured to receive power from the outside and to supply power to the main processor 210, the main short-range communication part 260, and the wireless communication board 3. The main power supply 220 is connected to the communication connection 280 to supply power to the wireless communication board 3.

The main short-range communication part 260 is connected to the main processor 210, and is configured to transmit and receive signals to and from the short-range communication part 60 provided on the wireless communication board 3. The main short-range communication part 260 may be configured to communicate in a narrower area than an area in which the wireless communication part 10 of the wireless communication board 3 may communicate wirelessly with an external device. For example, the main short-range communication part 260 may be configured to implement at least one communication standard among a radio frequency identification RFID, near field communication NFC, and infrared ray communication like the short-range communication part 60 of the wireless communication board 3.

The communication connection 280 is provided on the main circuit board 201 to be connected to the wireless communication board 3. The communication connection 280 may be implemented as a connector including a plurality of terminals 281 and 282 to be connected to the wire connection 80 of the wireless communication board 3 with a connection wire 250.

The connector implementing the communication connection 280 may be a male connector or a female connector. The plurality of terminals of the connector 280 may include a power terminal 281 and a ground terminal 282. In other words, in this embodiment, the connector of the communication connection 280 includes two terminals 281 and 282. Accordingly, power of the main power supply 220 input to the plurality of terminals 281 and 282 of the connector 280 may be supplied to the power supply 20 of the wireless communication board 3.

The connector implementing the communication connection 280 is connected to the wire connection 80 of the wireless communication board 3 through the connection wire 250. The connector 253 of the connection wire 250 to be coupled to the connector of the communication connection 280 is determined according to the connector implementing the communication connection 280. For example, when the communication connection 280 is formed as a male connector, the connector 253 of the connection wire 250 to be coupled to the communication connection 280 is formed as a female connector. Conversely, when the communication connection 280 is formed as a female connector, the connector 253 of the connection wire 250 to be coupled to the communication connection 280 is formed as a male connector.

As illustrated in FIG. 16, the wireless communication board 3 according to certain embodiments may be connected to the main board 200 with the connection wire 250. In detail, the connector of the wire connection 80 of the wireless communication board 3 and the connector of the communication connection 280 of the main board 200 are connected by the connection wire 250.

Then, the power supply 20 of the wireless communication board 3 is connected to the main power supply 220 of the main board 200 through the wire connection 80 and the communication connection 280. Accordingly, the wireless communication board 3 may operate by receiving power from the main board 200.

The communication processor 11 of the wireless communication board 3 is connected to the main processor 210 of the main board 200 through the short-range communication part 60 and the main short-range communication part 260. Accordingly, under the control of the main processor 210 of the main board 200, the wireless communication board 3 may wirelessly transmit a signal to an external device, and transmit a signal input from the external device to the main processor 210 of the main board 200.

Hereinafter, an electronic device in which a wireless communication board according to various embodiments having the above-described structure is disposed will be described with reference to FIGS. 17 to 19.

Figure 17:
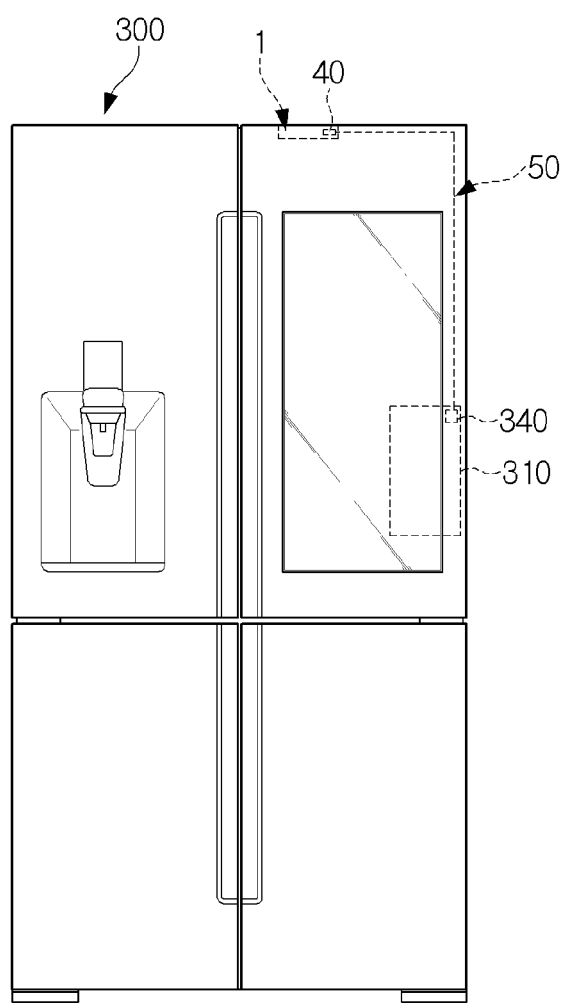
FIG. 17 is a view illustrating a refrigerator including a wireless communication board according to various embodiments of the present disclosure.

FIG. 17 is a view illustrating a refrigerator including a wireless communication board according to various embodiments of the present disclosure.

Referring to FIG. 17, a main board 310 of a refrigerator 300 is disposed on the rear side of the refrigerator 300. Because the outer surface of the refrigerator 300 is made of metal that prevents wireless communication, a wireless communication board 1 may not be directly disposed on the main board 310. Accordingly, the wireless communication board 1 is disposed on the upper surface of the refrigerator 300 to emit a wireless signal without interference. In this case, the main board 310 may be implemented as a central control board configured to control the operation of the refrigerator 300 as a whole.

In this case, because the wireless communication board 1 is far away from the main board 310, the wireless communication board 1 is connected to the main board 310 through a connection wire 50. In detail, the connector of the wire connection 40 of the wireless communication board 1 and the connector of the communication connection 340 of the main board 310 are connected to each other with the connection wire 50. Then, the main processor of the main board 310 may control the wireless communication board 1 to perform wireless communication with an external device. In this case, the surface mounting pad of the wireless communication board 1 is not connected to the main board 310 of the refrigerator 300.

Figure 18:
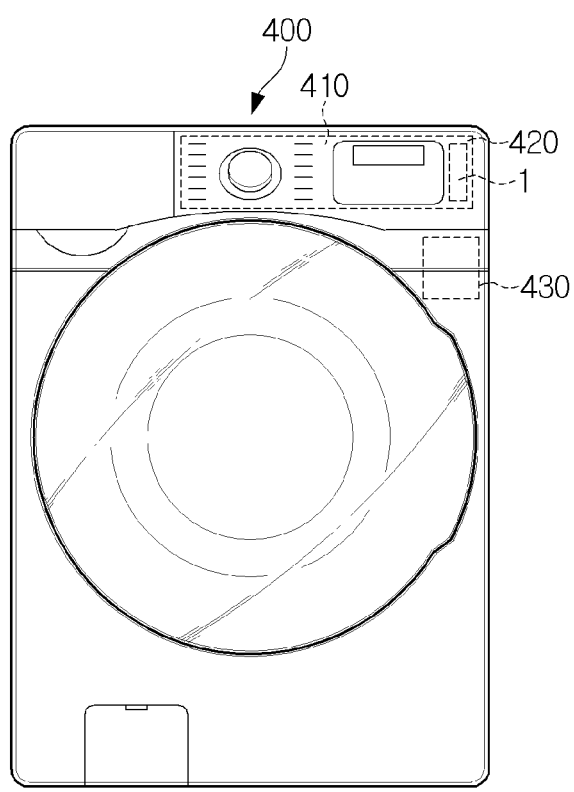
FIG. 18 is a view illustrating a washing machine including a wireless communication board according to various embodiments of the present disclosure.

FIG. 18 is a view illustrating a washing machine including a wireless communication board according to various embodiments of the present disclosure.

Referring to FIG. 18, an operation panel 410 is provided on the upper portion of the front surface of a washing machine 400, and a main board 420 is disposed inside of the operation panel 410. Because the operation panel 410 is made of plastic, the operation panel 410 does not interfere with wireless communication. Therefore, when the wireless communication board 1 is disposed inside the operation panel 410, wireless communication is not interfered, so that the wireless communication board 1 is disposed on the main board 420 located inside the operation panel 410. Here, the main board 420 of the washing machine 400 may be implemented as an operation panel board on which a user may input a command. The operation panel board 420 may be connected to a central control board 430 that is disposed on the upper side of the inside of the washing machine 400 and configured to control the operation of the washing machine 400 as a whole.

In this case, because the wireless communication board 1 is directly disposed on the main board 420, the wireless communication board 1 is connected to the main board 420 through the surface mounting pad. In detail, the plurality of pads of the surface mounting pad 30 (see FIG. 2) of the wireless communication board 1 and the plurality of pads of the communication connection of the main board 420 are connected by soldering using surface mounting technology. Then, the main processor of the main board 420 may control the wireless communication board 1 to perform wireless communication with an external device. In this case, the wire connection 40 of the wireless communication board 1 is not connected to the main board 420 of the washing machine 400.

Figure 19:
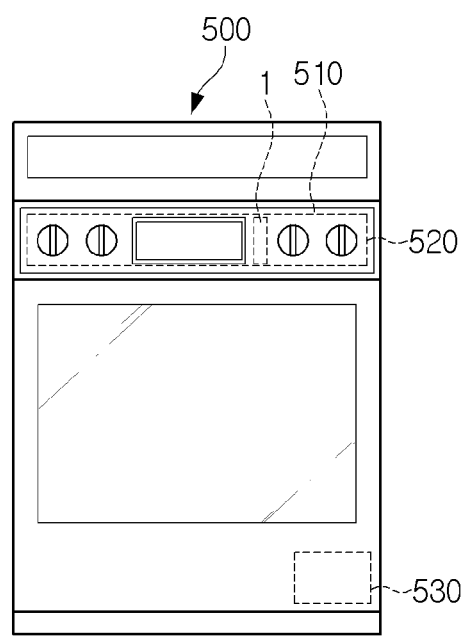
FIG. 19 is a view illustrating an oven including a wireless communication board according to various embodiments of the present disclosure.

FIG. 19 is a view illustrating an oven including a wireless communication board according to various embodiments of the present disclosure.

Referring to FIG. 19, an operation panel 510 is provided on the upper portion of the front surface of an oven 500, and a main board 520 is disposed inside of the operation panel 510. Because the operation panel 510 is made of plastic, the operation panel 510 does not interfere with wireless communication. Therefore, when the wireless communication board 1 is disposed inside the operation panel 510, wireless communication is not interfered, so that the wireless communication board 1 is disposed on the main board 520 located inside the operation panel 510. Here, the main board 520 of the oven 500 may be implemented as an operation panel board on which a user may input a command. The board 520 may be connected to a central control board 530 that is disposed at the lower side of the inside of the oven 500 and is configured to control the oven 500 as a whole.

In this case, because the wireless communication board 1 is directly disposed on the main board 520, the wireless communication board 1 is connected to the main board 520 through the surface mounting pad. In detail, the plurality of pads of the surface mounting pad 30 of the wireless communication board 1 and the plurality of pads of the communication connection of the main board 520 are connected by soldering using surface mounting technology. Then, the main processor of the main board 520 may control the wireless communication board 1 to perform wireless communication with an external device. In this case, the wire connection 40 of the wireless communication board 1 is not connected to the main board 520 of the oven 500.

The wireless communication board according to certain embodiments as described above may be used in both a refrigerator in which the wireless communication board is connected to the main board through a connection wire, and a washing machine and an oven in which the wireless communication board is connected to the main board through a surface mounting pad. Therefore, the wireless communication board according to certain embodiments may be applied to all electronic devices such as refrigerators, washing machines, ovens, dryers, air conditioners, clothes management apparatuses, and the like, in which the wireless communication board installation positions are different. Accordingly, there is an advantage that the management cost of the wireless communication board may be reduced.

In addition, the wireless communication board according to certain embodiments includes two connection structures, that is, a surface mounting pad and a wire connection on one board, so the wireless communication board may be applied to various electronic devices having different connection structures. Accordingly, the number of parts to be managed by a factory that manufactures various electronic devices may be reduced.

In addition, because the wireless communication board according to certain embodiments includes two connection structures, that is, a surface mounting pad and a wire connection on one board, when designing an electronic device, the installation position of the wireless communication board may be set in various ways. Accordingly, the degree of freedom in designing the electronic device may be increased.

The disclosure has been described above in an exemplary manner. The terms used herein are for the purpose of description and should not be construed in a limiting sense. Various modifications and variations of the disclosure are possible according to the above contents. Accordingly, unless otherwise stated, the disclosure may be practiced freely within the scope of the claims.

What is claimed is:

1. An electronic device comprises:
a main board; and
a wireless communication board connected to the main board,
wherein the main board comprises:
  a main circuit board;
  a main processor disposed on the main circuit board and configured to control the electronic device;
  a communication connection provided on the main circuit board and connected to the wireless communication board; and
  a main power supply disposed on the main circuit board and configured to supply power to the main processor and the wireless communication board,
wherein the wireless communication board comprises:
  a communication board;
  a wireless communication part disposed on the communication board;
  a power supply disposed on the communication board and configured to supply power to the wireless communication part;
  a surface mounting pad connected to the wireless communication part and the power supply, formed on the communication board disposed on the main board by surface mounting technology; and
  a wire connection connected to the wireless communication part and the power supply, provided on the communication board connected to the main board with a wire, and
wherein the communication connection of the main board is formed to correspond to one of the surface mounting pad and the wire connection of the wireless communication board.

2. The electronic device of claim 1, wherein:
the communication connection of the main board is formed as a plurality of pads corresponding to a plurality of pads of the surface mounting pad of the wireless communication board, and
the wireless communication board is disposed on the communication connection of the main board by surface mounting technology.

3. The electronic device of claim 1, wherein:
the communication connection of the main board includes a connector corresponding to a connector forming the wire connection of the wireless communication board.

4. The electronic device of claim 3, wherein:
the wireless communication board includes a connection wire provided with connectors corresponding to the connector of the main board and the connector of the wireless communication board at both ends thereof and connecting the connector of the main board and the connector of the wireless communication board.

5. The electronic device of claim 4, wherein:
the connector forming the wire connection of the wireless communication board includes a plurality of signal transmission terminals connected to the wireless communication part, and a power terminal and a ground terminal connected to the power supply.

6. The electronic device of claim 1, wherein:
the surface mounting pad of the wireless communication board includes a plurality of signal transmission pads connected to the wireless communication part and a power pad and a ground pad connected to the power supply.

7. The electronic device of claim 1, wherein:
the main board includes a main short-range communication part connected to the main processor, and
the communication connection of the main board is connected to the main power supply.

8. The electronic device of claim 7, wherein:
the wireless communication board further comprises a short-range communication part that is connected to the wireless communication part and is configured to wirelessly communicate with the main short-range communication part,
the surface mounting pad of the wireless communication board includes a power pad and a ground pad connected to the power supply, and
the wire connection of the wireless communication board includes a connector connected to the power supply.

9. The electronic device of claim 8, wherein the short-range communication part comprises a radio frequency identification RFID, near field communication NFC, and infrared ray communication.

10. The electronic device of claim 1, wherein the wire connection of the wireless communication board comprises a plurality of contacts and connector couplings provided on an edge of the communication board.

11. The electronic device of claim 10, wherein:
the wireless communication board includes a board insertion connector including a plurality of corresponding contacts that are in contact with the plurality of contacts of the wire connection and corresponding coupling parts coupled to the connector couplings, and
wherein the edge of the communication board is inserted into the board insertion connector so that the board insertion connector is connected to the wire connection.

12. The electronic device of claim 1, wherein the wireless communication part comprises Wi-Fi, Zig bee, Z-wave, and Bluetooth.

13. An electronic device comprises:
a main board; and
a wireless communication board connected to the main board,
wherein the main board comprises:
  a main circuit board;
  a main processor disposed on the main circuit board and configured to control the electronic device;
  a communication connection provided on the main circuit board and connected to the wireless communication board; and
  a main power supply disposed on the main circuit board and configured to supply power to the main processor and the wireless communication board,
wherein the wireless communication board comprises:
  a communication board;
  a wireless communication part disposed on the communication board;
  a power supply disposed on the communication board and configured to supply power to the wireless communication part;
  a short-range communication part connected to the wireless communication part and configured to wirelessly transmit and receive a signal to and from a main short-range communication part provided on the main board;
  a surface mounting pad connected to the power supply, the surface mounting pad disposed on the main board by surface mounting technology; and
  a wire connection connected to the power supply, the wire connection configured to be connected to the main board by a wire.

14. The electronic device of claim 13, wherein the surface mounting pad comprises a plurality of pads provided on a surface of the communication board.

15. The electronic device of claim 14, wherein the plurality of pads comprises signal transmission pads and power supply pads.

16. The electronic device of claim 13, wherein the communication connection of the main board includes a connector corresponding to a connector forming the wire connection of the wireless communication board.

17. The electronic device of claim 16, wherein the connector comprises signal transmission terminals and power supply terminals.

18. The electronic device of claim 16, wherein:
the wireless communication board includes a connection wire provided with connectors corresponding to the connector of the main board and the connector of the wireless communication board at both ends thereof and connecting the connector of the main board and the connector of the wireless communication board.

19. The electronic device of claim 13, wherein the wire connection comprises a plurality of contacts and connector couplings provided on an edge of the communication board.

20. The electronic device of claim 19, wherein the wireless communication board further comprises a board insertion connector including a plurality of corresponding contacts that are in contact with the plurality of contacts of the wire connection and corresponding coupling parts coupled to the connector couplings, and
wherein the edge of the communication board is inserted into the board insertion connector so that the board insertion connector is connected to the wire connection.

* * * * *

UNITED STATES PATENT AND TRADEMARK OFFICE
CERTIFICATE OF CORRECTION

| | |
|---|---|
| PATENT NO. | : 11,968,783 B2 |
| APPLICATION NO. | : 17/653601 |
| DATED | : April 23, 2024 |
| INVENTOR(S) | : Park et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this
Twelfth Day of August, 2025

Coke Morgan Stewart
*Acting Director of the United States Patent and Trademark Office*